(12) United States Patent
Lapinksi et al.

(10) Patent No.: US 6,771,058 B2
(45) Date of Patent: Aug. 3, 2004

(54) APPARATUS AND METHOD FOR THE MEASUREMENT AND MONITORING OF ELECTRICAL POWER GENERATION AND TRANSMISSION

(75) Inventors: Sterling Lapinksi, Louisville, KY (US); John Carroll Hill, Pewee Valley, KY (US)

(73) Assignee: Genscape, Inc., Lousiville, KY (US)

( * ) Notice: Subject to any disclaimer, the term of this patent is extended or adjusted under 35 U.S.C. 154(b) by 33 days.

(21) Appl. No.: 10/300,325

(22) Filed: Nov. 20, 2002

(65) Prior Publication Data

US 2003/0098683 A1 May 29, 2003

Related U.S. Application Data

(63) Continuation of application No. 09/835,250, filed on Apr. 13, 2001, now abandoned.
(60) Provisional application No. 60/226,130, filed on Aug. 18, 2000, and provisional application No. 60/196,720, filed on Apr. 13, 2000.

(51) Int. Cl.$^7$ ............................................. G01R 31/00

(52) U.S. Cl. ................................. 324/117 R; 324/142

(58) Field of Search .................. 324/117 R, 117 H, 324/126, 127, 142; 702/57, 60, 62; 340/660, 870.02, 870.01, 870.03

(56) References Cited

U.S. PATENT DOCUMENTS

| | | | |
|---|---|---|---|
| 3,312,898 A | 4/1967 | Browne, Jr. ................. | 324/117 |
| 3,652,935 A | 3/1972 | Shaw .......................... | 324/127 |
| 3,959,724 A | 5/1976 | Chana et al. ................. | 324/142 |
| 4,002,975 A | 1/1977 | Erickson et al. .............. | 324/96 |
| 4,158,810 A | 6/1979 | Leskovar ..................... | 324/127 |
| 4,277,744 A | 7/1981 | Audone et al. ............... | 324/72 |
| 4,361,805 A | 11/1982 | Narimatsu et al. ........... | 324/207 |
| 4,384,289 A | 5/1983 | Stillwell et al. ........ | 340/870.16 |
| 4,395,677 A | 7/1983 | Petersdorf ................ | 324/117 H |
| 4,414,510 A | 11/1983 | Milkovic ..................... | 324/252 |
| 4,539,520 A | 9/1985 | McBride ................. | 324/117 H |
| 4,635,055 A | 1/1987 | Fernandes et al. ..... | 340/870.17 |
| 4,700,188 A | 10/1987 | James .................... | 340/870.03 |
| 4,709,339 A | 11/1987 | Fernandes ................... | 364/492 |
| 4,717,872 A | 1/1988 | Wagner et al. ............... | 324/127 |
| 4,727,323 A | 2/1988 | Zabler ........................ | 324/252 |
| 4,728,887 A | 3/1988 | Davis .......................... | 324/127 |
| 4,799,005 A | 1/1989 | Fernandes ................... | 324/127 |
| 4,801,937 A | 1/1989 | Fernandes .............. | 340/870.16 |
| 4,806,855 A | 2/1989 | Davis ......................... | 324/127 |

(List continued on next page.)

OTHER PUBLICATIONS

Staats, Preston, Trent, *Apparatus and Method for Monitoring Power and Current Flow*, U.S. patent application No. 09/332,850, filed Jun. 14, 1999, Publication No. US 2002/0101231 A1, published Aug. 1, 2002.

"IEEE Standard Procedures for Measurment of Power Frequency Electric and Magnetic Fields from AC Power Lines", *IEEE Std.*, 644–1994, Institute of Electrical and Electronics Engineers, New York, NY, 1994.

Fulcomer, "NB Ambient Magnetic Field Meter For Measurement and Analysis of Low–Level Power Frequency Magnetic Fields in Air", By U.S. Dept. of Commerce, NBSIR 96–330, Dec. 1985.

*Primary Examiner*—Vinh P. Nguyen
(74) *Attorney, Agent, or Firm*—Stites & Harbison, PLLC; David W. Wagle, Jr.

(57) ABSTRACT

An apparatus and method allows for a determination of the amount and direction of electric power flowing over a particular high-voltage electric power transmission line without proximate access to said transmission line, and thus can be used to provide a determination of the amount of electric power being produced by any particular electric power generation plant connected to an electric power transmission grid.

8 Claims, 9 Drawing Sheets

U.S. PATENT DOCUMENTS

| | | |
|---|---|---|
| 4,808,917 A | 2/1989 | Fernandes et al. ........... 324/127 |
| 4,829,298 A | 5/1989 | Fernandes .............. 340/870.27 |
| 4,847,780 A | 7/1989 | Gilker et al. ................ 364/483 |
| 4,857,837 A | 8/1989 | Baran et al. ............ 324/117 R |
| 4,886,980 A | 12/1989 | Fernandes et al. ............ 307/64 |
| 4,891,576 A | 1/1990 | Jacobs et al. ................. 324/72 |
| 5,006,846 A | 4/1991 | Granville et al. ...... 340/870.28 |
| 5,049,809 A | 9/1991 | Wakatsuki et al. ...... 324/117 R |
| 5,140,257 A | 8/1992 | Davis ........................ 324/106 |
| 5,181,026 A | 1/1993 | Granville ............... 340/870.28 |
| 5,194,850 A * | 3/1993 | Bourrieres et al. ......... 340/660 |
| 5,206,596 A | 4/1993 | Beihoff et al. .............. 324/536 |
| 5,250,894 A | 10/1993 | Bridges et al. ......... 324/117 H |
| 5,438,256 A | 8/1995 | Thuries et al. .......... 324/117 R |
| 5,473,244 A | 12/1995 | Libove et al. .............. 324/126 |
| 5,517,106 A | 5/1996 | Longini ...................... 324/142 |
| 5,545,981 A | 8/1996 | Dubin et al. ............... 324/142 |
| 5,568,402 A | 10/1996 | Gray et al. ............. 364/514 C |
| 5,570,034 A | 10/1996 | Needham et al. ........... 324/763 |
| 5,673,196 A | 9/1997 | Hoffman et al. ............. 364/483 |
| 5,717,388 A | 2/1998 | Janoska et al. ........ 340/870.16 |
| 5,729,144 A | 3/1998 | Cummins ................... 324/535 |
| 5,757,283 A | 5/1998 | Janoska ................. 340/870.16 |
| 5,764,065 A | 6/1998 | Richards et al. ............. 324/551 |
| 5,767,668 A | 6/1998 | Durand ................... 324/117 R |
| 5,808,558 A | 9/1998 | Meek et al. ........... 340/870.01 |
| 5,808,902 A | 9/1998 | Levert et al. ............... 364/492 |
| 5,995,911 A | 11/1999 | Hart ............................ 702/64 |
| 6,026,355 A | 2/2000 | Rahman et al. ............. 702/189 |
| 6,058,354 A | 5/2000 | Adame et al. ................ 702/60 |
| 6,061,609 A | 5/2000 | Kanoi et al. ................ 700/291 |
| 6,088,688 A | 7/2000 | Crooks et al. ............... 705/412 |
| 6,107,791 A | 8/2000 | Lee ............................ 324/72.5 |
| 6,154,023 A | 11/2000 | Durand ................... 324/117 R |
| 6,229,451 B1 | 5/2001 | Brown ....................... 340/657 |
| 6,237,332 B1 | 5/2001 | Thoma et al. ......... 340/825.06 |
| 6,291,986 B1 | 9/2001 | Sorensen .................... 324/156 |
| 6,311,105 B1 | 10/2001 | Budike, Jr. ................. 700/291 |

* cited by examiner

APPARATUS AND METHOD FOR THE MEASUREMENT AND MONITORING OF ELECTRICAL POWER GENERATION AND TRANSMISSION

CROSS-REFERENCE TO RELATED APPLICATIONS

This patent application is a continuation application of U.S. patent application Ser. No. 09/835,250, filed on Apr. 13, 2001, now abandoned entitled "APPARATUS AND METHOD FOR THE MEASUREMENT AND MONITORING OF ELECTRICAL POWER GENERATION AND TRANSMISSION," which is fully incorporated by reference herein.

BACKGROUND OF THE INVENTION

The present application claims priority from U.S. provisional application 60/196,720 filed on Apr. 13, 2000 and U.S. provisional application 60/226,130 filed Aug. 18, 2000. This application relates to an apparatus and method for the measurement and monitoring of electric power generation and transmission associated with one or more power generating plants. Tile entire disclosures contained in U.S. provisional applications 60/196,720 and 60/226,130, including the attachments thereto, are incorporated herein by this reference.

Various apparatus and methods currently exist for measuring and monitoring the amount of electric power generated by any particular electric power generation facility connected to an electric power transmission grid. Common apparatus and methods are also available for measuring and monitoring the amount of electric power flowing over any particular transmission line. Specifically, most electric power plant operators employ a Supervisory Control and Data Acquisition (SCADA) system to monitor their electric power generation and transmission systems. Each substation connected to the transmission grid is equipped with several potential transformers (PT) and current transformers (CT) to measure the voltage, current, and electric power flow on each line and bus. The PT and CT data is monitored in real time and transmitted back to a central computer from each substation through a Remote Terminal Unit (RTU) using various wired and wireless communication methods. Such data is compiled to provide the electric power plant operators with accurate and up-to-date generation and transmission data.

Of course, implementation of these methods requires proximate access to the physical facilities associated with the generation and transmission of electric power. The owner or manager of these physical facilities is able to control or limit proximate access to said facilities, and thus is able to prevent any particular party that employs current technology from directly measuring and monitoring either the amount of electric power flowing over a particular transmission line or the amount of electric power being generated by a particular electric power generation facility. Information about electric transmission line flows and electric power generation facility output is useful and valuable for companies engaged in the business of buying and selling electricity on the open market, and power plant operators currently do not release this information to other participants in the market.

It is thus a paramount object of the present invention to provide an apparatus and method for the measurement and monitoring of electric power generation and transmission associated with a plurality of power generation plants without necessity of proximate access to the physical facilities associated with the generation and transmission of electric power.

It is a further object of the present invention to provide an apparatus and method that is capable of ascertaining both the amount and direction of electric power flowing over transmission lines and the amount of electric power generated by any electric power generation plant connected to those lines without necessity of proximate access to the physical facilities associated with the generation and transmission of electric power.

These and other objects and advantages of the present invention will become apparent upon a reading of the following description.

SUMMARY OF THE INVENTION

The present invention is an apparatus and method for the measurement and monitoring of electric power generation and transmission associated with one or more power generating plants. Specifically, the apparatus and method of the present invention allows for a determination of the amount and direction of electric power flowing over a particular high-voltage electric power transmission line, allows for a determination of the real and reactive components of the electric power, and further allows for a determination of the amount of electric power being produced by any particular electric power generation plant connected to an electric power transmission grid.

The apparatus of the present invention is comprised primarily of one or more monitoring devices that collect the information necessary to determine the electric power flow on any particular transmission line being monitored. Specifically, a monitoring device in accordance with the present invention is installed in a fixed location near a high-voltage electric power transmission line. During the installation process, appropriate measurements are made to establish the spatial relationship between the monitoring device and the multiple phase conductors of the transmission line. The monitoring device is primarily comprised of sensing elements responsive to the electric potential and the magnetic flux densities associated with the transmission line, therefore allowing for periodic or continuous measurements of the electric potential and magnetic flux densities associated with the transmission line.

The method of the present invention relates not only to the collection of information, but also the transmission and processing of the collected information. Specifically, the method of the present invention contemplates discreet or continuous data transmissions of collected information from remote monitoring devices, each of which monitors a particular transmission line or lines, to a central processing facility where a computational analysis is conducted to calculate the amount and direction of both real and reactive electric power flowing on each monitored set of transmission lines. The resulting power data can be further analyzed and compiled to determine the net electric power output of any electric power generating facility connected to the monitored transmission lines.

DETAILED DESCRIPTION OF THE INVENTION

The present invention is an apparatus and method for the measurement and monitoring of electric power generation and transmission associated with one or more electric power generating plants. This is preferably accomplished through measurement and collection of data related to the amount of electric power flowing over one or more transmission lines operably connected to a particular electric power grid and operably connected to said one or more electric power generating plants. Computational analysis of this data allows for a determination of the specific amount of electric power being generated by these electric power plants connected to the transmission and distribution grid.

Electric power is distributed over most public transmission grids in three-phase form, each of said phases being carried over a separate conductor. For purposes of the present application, the term "transmission line" is used to refer to the three separate conductors. Each of these separate phases generates its own time-varying magnetic and electric fields. The three phases are out of phase with each other by one third of a cycle, such that the sum of the fields generated by these three phases would essentially be zero if all three phases were transmitted over conductors that were closely packed. The physics of electric power transmission, however, dictates that the three phases maintain physical separation, the distances for which are determined by factors such as line voltage, insulator effectiveness, etc. This physical separation means that the electric and magnetic fields produced by each phase do not completely cancel each other. In accordance with the Biot-Savart Law of Magnetic Field's and Laplace's Equation, any point in space around these three phases will contain an electric potential and a magnetic field that are determined by a known set of factors. These factors include: line voltage, amount of current, direction of current, spatial arrangement of the three conductors with respect to each other and to the measurement point, and the electromagnetic properties of the surrounding environment.

The present invention employs sensors to measure the electric potential and the various vector components of the magnetic field surrounding the transmission lines. For purposes of this description, the equipment which is located remotely but within the general proximity of the transmission lines is referred to as the "monitoring device."

Figure 1:
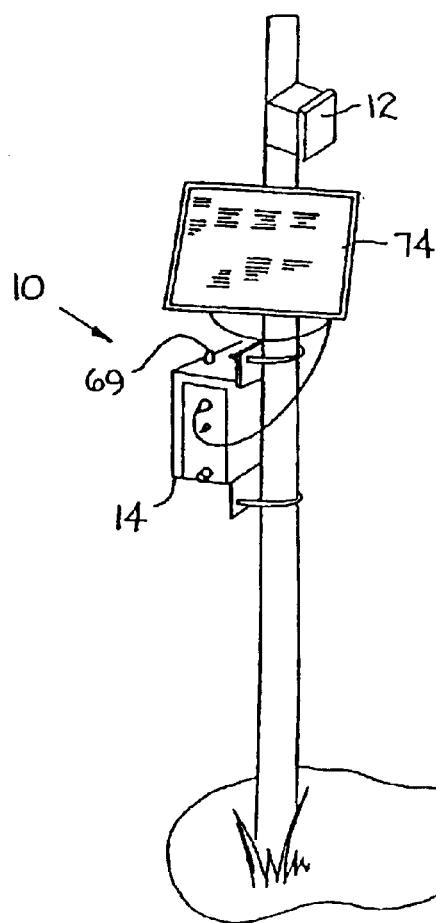
FIG. 1 is a perspective view of a preferred embodiment of the apparatus for the measurement and monitoring of electric power generation and transmission in accordance with the present invention.

Referring now to FIG. 1, in the preferred embodiment, the monitoring device 10 consists of (1) a first weatherproof housing (generally indicated by reference numeral 12) containing the electric potential and magnetic field measurement components necessary to carry out the function of the present invention (the "sensor unit"), and (2) a second weatherproof housing (generally indicated by reference numeral 14) containing the necessary processing and communications components, including a power supply and data transmission equipment. Of course, all components could be combined in a single housing without departing from the spirit and scope of the present invention.

Figure 2:
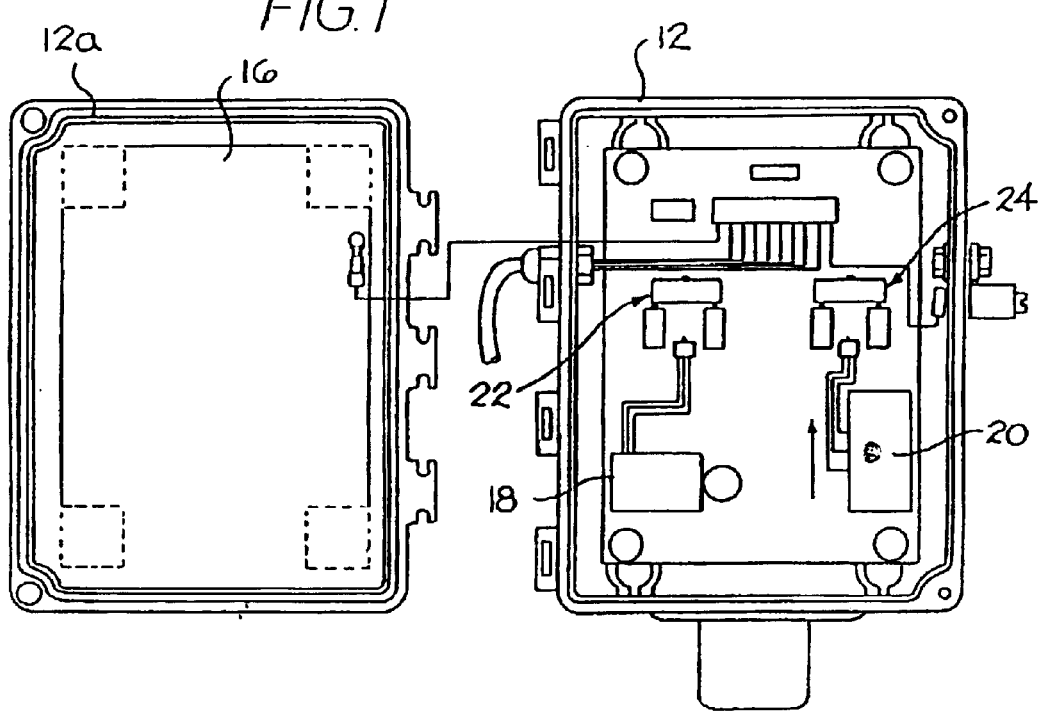
FIG. 2 is a plan view of the interior of the first weatherproof housing of the apparatus of FIG. 1, which contains the electric and magnetic field measurement components necessary to carry out the function of the present invention, with the door of the housing in the open position.

FIG. 2 is a plan view of the sensor unit with the door 12a of the weatherproof housing 12 in the open position and the measurement components generally shown. In this preferred embodiment, electric potential measurement is accomplished by the use of a conducting plate 16 which is oriented vertically with respect to the ground, although other geometrical arrangements may also be used. The conducting plate is mounted on the inside door 12a of the weatherproof housing 12 and is isolated from the grounded door by means of a plurality of insulator bushings (indicated in phantom at the corners of the conducting plate 16). The conducting plate 16, together with the input capacitance of an operational amplifier circuit, create a capacitive voltage divider whose output voltage, an AC voltage at line frequency, is proportional to the net electric potential created by the voltages of the phases of the transmission lines. Of course, although a conducting plate 16 is used as the electric potential sensor 16 in this preferred embodiment, other sensors, including a wire grid sensor or a wire cage sensor, could also be used without departing from the spirit and scope of the present invention.

Regardless, although not shown in FIG. 2, the output measurement from the conducting plate 16 is applied to an amplification and filtration circuit for the purpose of removing extraneous noise from the readings. The preferred amplification and filtration circuit is discussed in further detail below with reference to FIG. 6.

Magnetic flux density measurement is accomplished by the use of coils 18 and 20, as shown in FIG. 2. Although what is actually being measured is the magnetic flux density, for purposes of the description herein, the generic term "magnetic field sensor" is used as a reference to the sensor measuring magnetic flux density. The first magnetic field sensor 18 is preferably a coil that measures the horizontal component of the magnetic field and is mounted such that the axis of the coil is both oriented in the direction of the magnetic field component desired to be measured, i.e. horizontal, and oriented normally to the generally parallel planes defined by the conductors of the transmission line being monitored. Likewise, the second magnetic field sensor 20 is a coil that preferably measures the vertical component, and is therefore vertically oriented with respect to underlying ground surface. Of course, non-horizontal and/or non-vertical vector components could also be measured without departing from the spirit and scope of the present invention. Furthermore, as will become clear in the computational analysis that follows, only one magnetic sensor is actually required to carry out the requisite magnetic flux density measurement in accordance with the present invention.

The voltage across each magnetic field sensor 18, 20 (an AC voltage at line frequency) is directly proportional to the time rate of change of the net magnetic flux density created by the currents flowing through the three conductors of the transmission line. Although coils are the preferred magnetic field sensors 18, 20, other means for sensing the magnetic flux density may also be employed, e.g., Hall Effect sensors, without departing from the spirit and scope of the present invention.

Of further note, three coils may be utilized to improve accuracy or aid in alignment of the other two coils. The third coil could potentially improve accuracy in situations in which the conductors are sagging significantly. The addition of the third coil would be oriented such that the sensitive axes of the three sensors are mutually perpendicular. Of course, the addition of this third axis of measurement would necessitate modification of the computational analysis to include a third coordinate accordingly.

As further shown in FIG. 2, the output measurements from the magnetic field sensors 18, 20 are also respectively applied to amplification and filtration circuits (indicated generally by reference numerals 22 and 24) for the purpose of removing extraneous noise from the readings. The preferred amplification and filtration circuits are discussed in further detail below with reference to FIG. 5.

Location of the monitoring device 10, and specifically the sensor unit 12, is governed by practical concerns such as access to property in close proximity to the transmission lines to be measured. In any case, the sensor unit 12 should be sufficiently close to the transmission line such that the sensors 16, 18, 20 are able to accurately measure the particular field being monitored. In the preferred embodiment, the magnetic field sensors 18, 20 and the electric potential sensor 16 are housed in close proximity to one another so that they are measuring fields at essentially the same point in space. An alternative arrangement is to locate the sensors at different locations, i.e., positioning the electric field sensor closer to the transmission lines than the magnetic field sensors. One particular advantage of such an alternative arrangement is to provide improved accuracy in situations of sagging and swaying transmission lines; specifically, increased accuracy is achieved in the electric potential measurement without creating the possibility for interference with the magnetic field sensors. In other words, in some circumstances, it might be advisable to place the electric potential sensor in a housing or enclosure near the transmission line, whereas the magnetic sensors are contained in a separate housing or enclosure located farther away from the transmission line.

Figure 3:
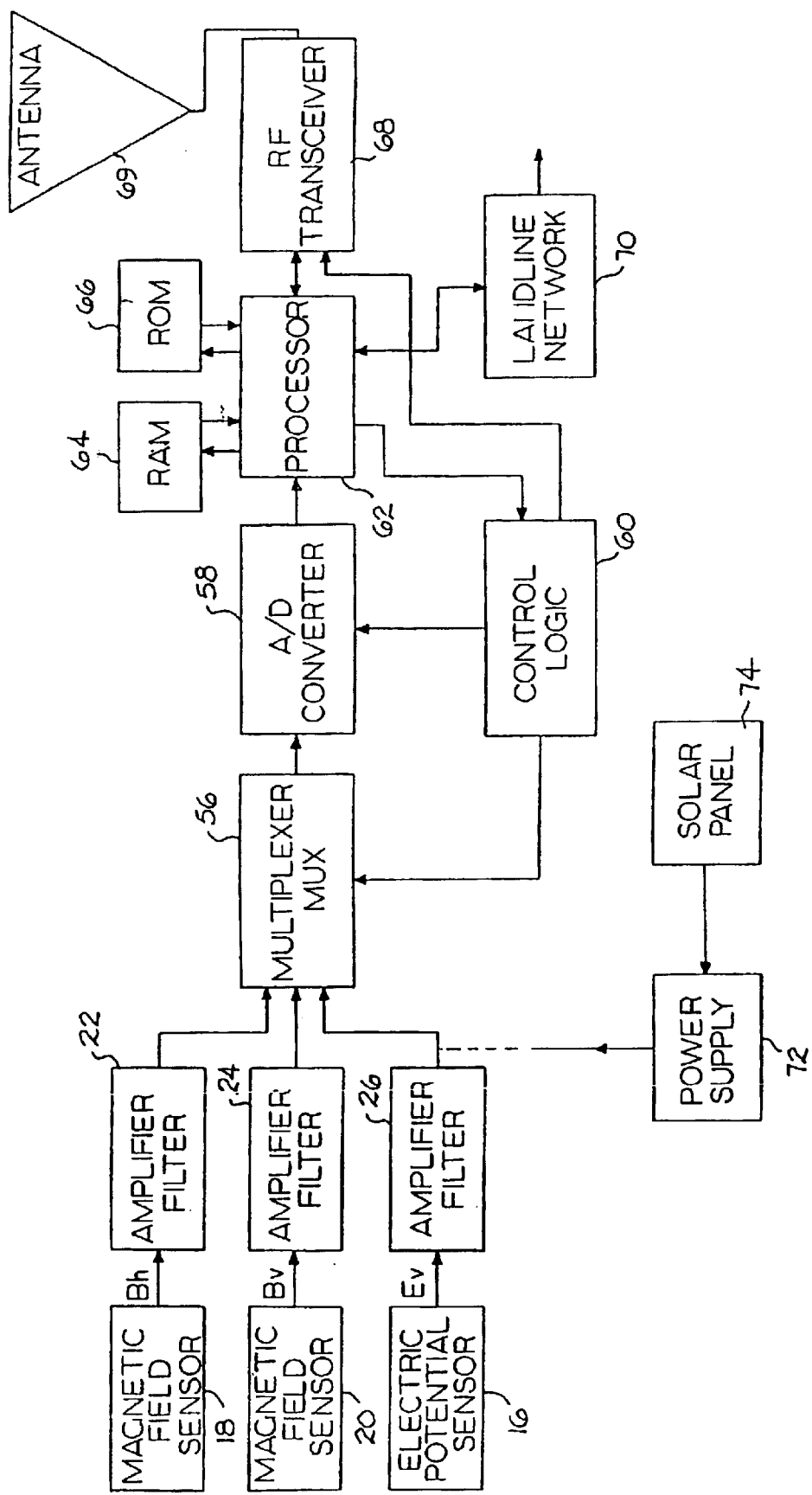
FIG. 3 is a block diagram depicting the preferred method for the measurement and monitoring of electric power generation and transmission in accordance with the present invention.

FIG. 3 is a block diagram of the external, field-installed portion of the invention—the monitoring device 10. As shown, the monitoring device 10 generally consists of the electric potential and magnetic field sensors 16, 18, 20; memory and data storage elements; programmable data processing elements; hard-wired or wireless communication elements; and a power supply. The monitoring device 10 is programmed such that it periodically collects data from various sensors, processes it into a form suitable for transmission, and transmits the information to a central processing facility where various processing routines are performed on the data to determine the amount and direction of electric power flowing over any particular electric power transmission line.

Specifically, the preferred monitoring device 10 includes at least two magnetic field sensors 18, 20, as described above with reference to FIG. 2 and which are oriented to respond to the horizontal ($B_H$) and vertical ($B_V$) components of the magnetic field, each sensor specifically measuring the time rate of change of the net magnetic flux density. The monitoring device of tile present invention also includes an electric potential sensor 16, which is also described above with reference to FIG. 2.

The output voltage of the first magnetic field sensor 18 is applied to an amplification and filtration circuit 22 which has a dual function. The primary function of the amplification and filtration circuit 22 is to amplify the relatively small output voltage of the first magnetic field sensor 22 to a level that will be suitable as an input to an analog-to-digital converter. The secondary function of the circuit 22 is to serve as a low-pass filter, removing extraneous noise from the output voltage of the magnetic field sensor 18. Similarly, the output voltage of the second magnetic field sensor 20 is applied to another amplification and filtration circuit 24 to amplify the voltage and remove extraneous noise. Finally, the output voltage of the electric field sensor 16 is applied to yet another amplification and filtration circuit 26 to amplify the voltage and remove extraneous noise.

The input impedances of the amplification and filtration circuits 22, 24, 26 affect the frequency responses and phase shifts of the respective sensors 16, 18, 20 so that, in fact, each sensor and associated amplification and filtration circuit combination functions as an integrated sensor. This is particularly important in the case of the electric potential sensor 16 as the input impedance of the amplification and filtration 26 must be very high in order to have the sensor/amplifier combination function at frequencies as low as 60 Hz.

Figure 5:
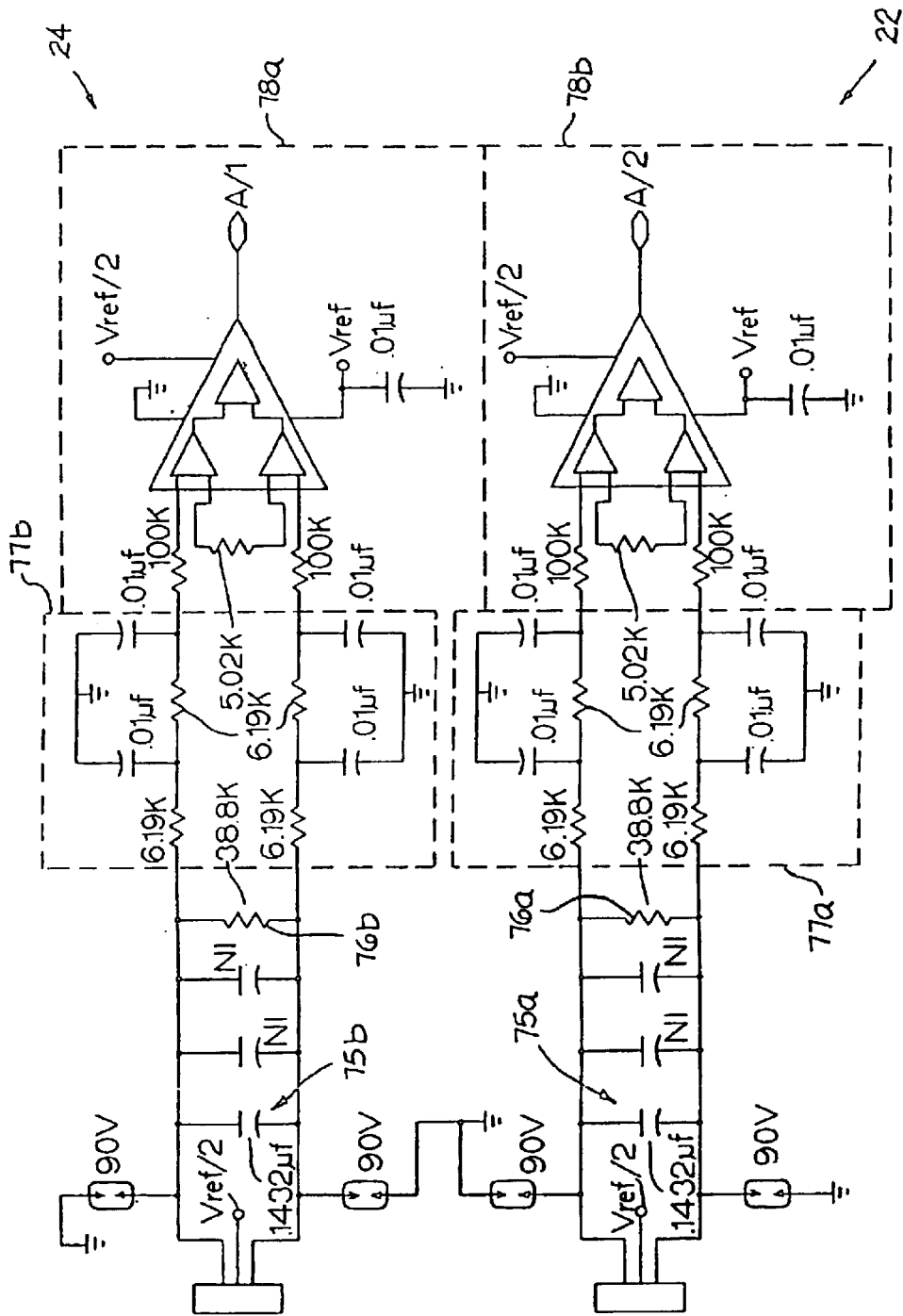
FIG. 5 is a schematic circuit diagram of a preferred amplification and filtration circuit for the magnetic field measurements associated with the apparatus and method of the present invention.

FIG. 5 depicts preferred amplification and filtration circuits 22, 24 for the magnetic fields sensors 18, 20, as mentioned above with respect to FIG. 2. Although various similar circuits could be employed by one of ordinary skill to achieve the same objective, in the preferred circuits of FIG. 5, the output from each magnetic field sensor 18, 20 is loaded by a capacitor 75a, 75b and a resistor 76a, 76b, whose respective values are selected to result in zero phase shift and a scale factor of 1.0 mv/milligauss for each sensor 18, 20, although it is understood that other capacitors may be used and the phase shifts corrected for computationally. Each output of the loaded sensors 18, 20 is then passed through a two-section RC lowpass filter 77a, 77b to provide a measure of radio frequency interference rejection. Finally, the outputs from the RC lowpass filters 77a, 77b are applied to the input terminals of a standard instrumentation amplifier 78a, 78b (e.g., a differential amplifier), the resulting output voltages being proportional to vector components of the magnetic flux density as measured by the magnetic field sensors 18, 20.

Figure 6:
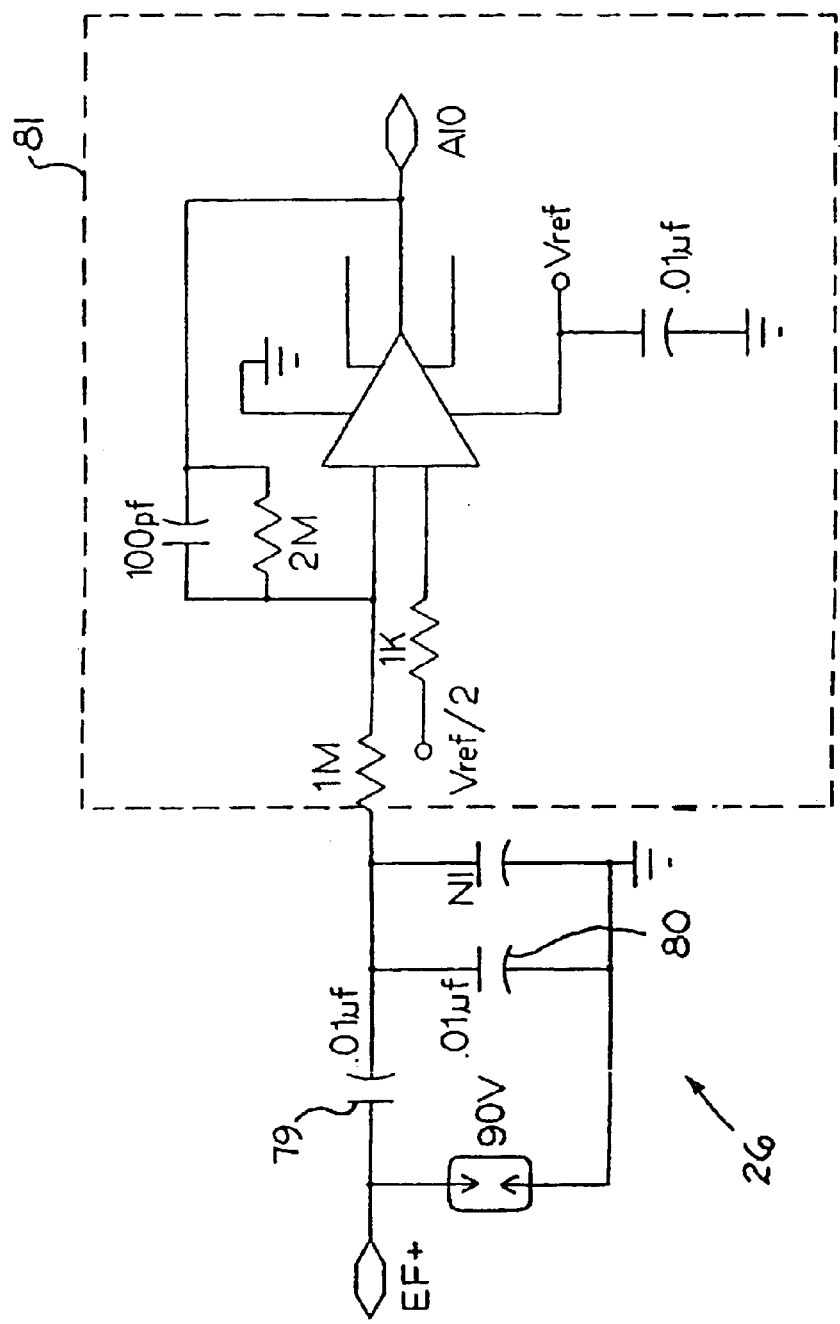
FIG. 6 is a schematic circuit diagram of a preferred amplification and filtration circuit for the electric potential measurements associated with the apparatus and method of the present invention.

FIG. 6 depicts a preferred amplification and filtration circuit 26 for the electric potential sensor 16, as mentioned above with respect to FIG. 2. Although various similar circuits could be employed by one of ordinary skill to achieve the same objective, in the preferred circuit of FIG. 6, the electric potential sensor 16 is connected through a capacitor 79 that functions as a DC block to a capacitor 80 connected to ground. This second capacitor 80 is referred to as "Ci" in the computational analysis that follows. The voltage across the second capacitor 80 is the input voltage to a standard operational amplifier active lowpass filter 81, which inverts the signal and filters out high frequency noise with the resulting output voltage being proportional to electric potential density as measured by the electric potential sensor 16.

After the amplification and filtration of the respective signals as described above, the output voltages are then applied to the inputs of an analog multiplexer (MUX) 56.

Before completing the description of the amplification and filtration circuitry, however, it is noteworthy that in an alternate embodiment, it is contemplated that an apparatus in accordance with the present invention include a sample-and-hold amplifier for the output of each filtered coil sensor. The output voltages of the respective amplification and filtration circuits 22, 24, 26 would be applied to the inputs of such sample-and-hold amplifiers before such output voltages are applied to the MUX 56 in order to avoid lime-skew in the subsequent conversion of these signals from analog to digital form. Sample-and-hold amplifiers are generally known in the art, and any conventional means for performing the sample-and-hold function maybe incorporated into the apparatus of the present invention as contemplated herein.

From the MUX 56, the two magnetic flux density signals and the electric potential signal each is separately passed through an analog-to-digital (A/D) converter 58. Which of the three signals is passed through to the analog-to-digital convertor 58 at any given time is determined by a control logic 60 associated with a microprocessor 62. This microprocessor 62 executes software code stored in random access memory (RAM) 64 and read-only memory (ROM) 66. Such software code derives from this digitized data the magnitude of the horizontal component of the magnetic flux density ($B_H$), the vertical component of the magnetic flux density ($B_V$), the magnitude of the electric potential signal (E), the phase angle of $B_H$ with respect to E ($H_a$), and the phase angle of $B_V$ with respect to E ($V_a$).

The converted data, now in digital form, is stored in the random access memory 64 of the microprocessor 62. The outputted signal from the microprocessor 62 is then transmitted to one or both of a radio frequency (RF) transceiver 68 with associated transmission antenna 69 and a landline network 70 for subsequent transmission of the signal to a central processing facility. Referring back to FIG. 1, the radio frequency (RF) transceiver 68 and any associated data transmission equipment is preferably contained in the second weatherproof housing 14.

Finally, with respect to FIG. 3, the individual electronic components of the monitoring device 10 are preferably powered by a battery 72 that may be continuously recharged by a solar panel array 74. Referring again to FIG. 1, the battery 72 is preferably contained in the second weatherproof housing 14, and solar panel array 74 is external to the housing 14, yet operably connected to the battery 72.

Figure 4:
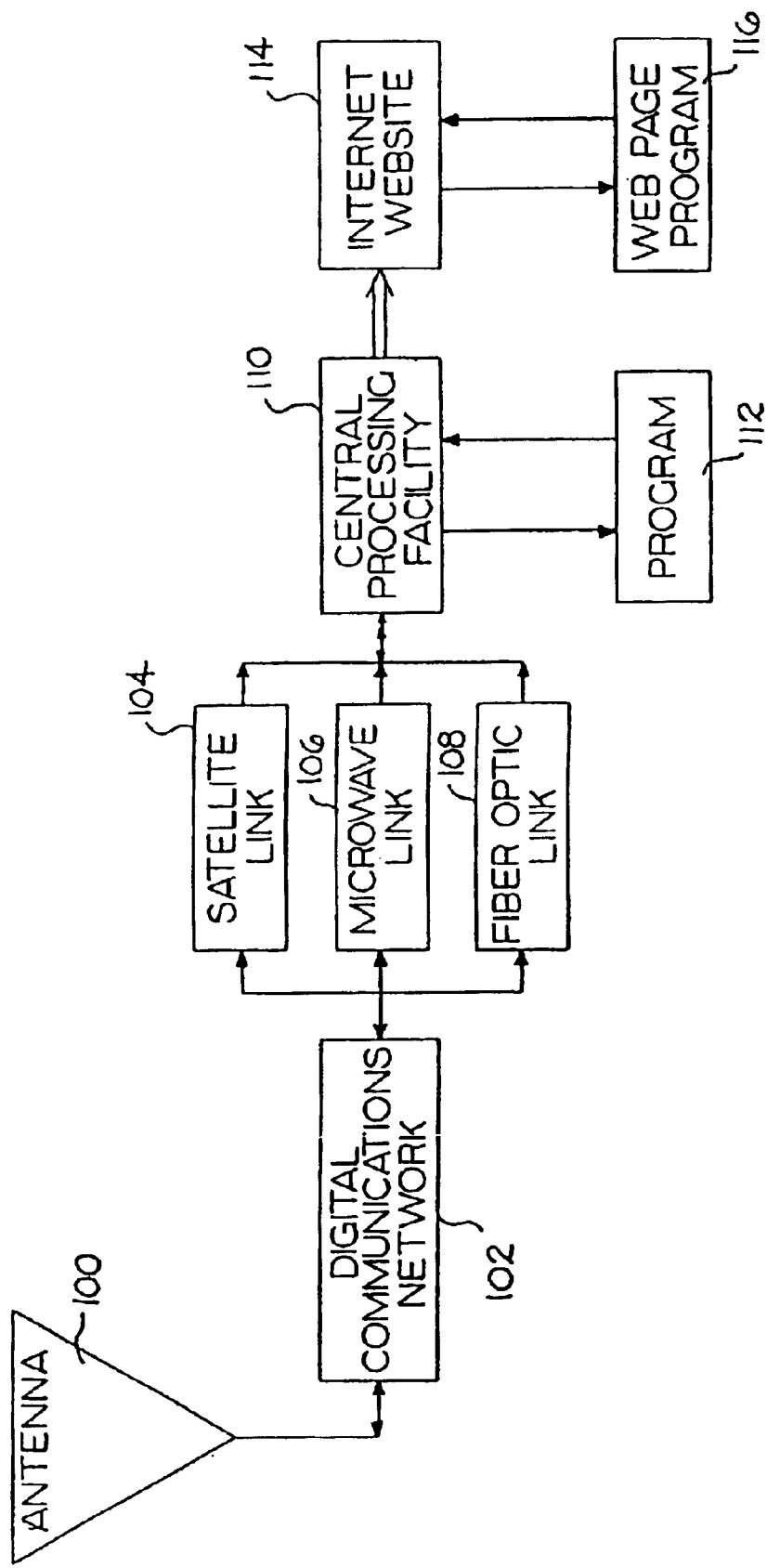
FIG. 4 is a block diagram depicting the preferred method of communicating information associated with the measured electric power generation and transmission in accordance with the present invention.

FIG. 4 is a block diagram of preferred communication components and the central processing facility of the apparatus and method of the present invention. These components are not installed in the field with the monitoring device 10, but rather are located at some remote location. Specifically, the outputted signal from the microprocessor 62 depicted in FIG. 3 is transmitted to the central processing facility via one or both of a radio frequency (RF) transceiver 68 with associated transmission antenna 69 and a landline network 70. A receiving antenna 100 or similar communication component receives this transmitted signal, which is representative of the measurements of the electric potential and magnetic field vectors in digital form. The receiving antenna 100 is operably connected to an analog or digital communications network 102 which transmits the signal to the central processing facility 110. Such transmission may be carried out, for example, by a satellite link 104, a microwave link 106, and/or a fiber optic link 108, although other data transmission means may certainly be used without departing from the spirit and scope of the present invention.

At the central processing facility 110, a computational analysis, as will be described in detail below, is performed by a digital computer program 112 to determine the magnitude and direction of the real and reactive power flow on the transmission line. Subsequently, for any particular electric power generation facility for which all, or most of, the connected transmission lines are measured and calculated in accordance with the present invention, through a simple summing of the power flows on each transmission line, the net electric power output of the facility can be determined. Then, such electric power generation and transmission data associated with one or more electric power generating plants can then be communicated to third parties. It is contemplated and preferred that such communication to third parties be through export of the data to an access-controlled Internet web site 114, which also may maintain an extensive database of physical and electric parameters of various electric power transmission lines. The data associated with electric power plants of interest to a particular party are then available to that party through a common Internet browser program 116, such as Netscape Navigator® or Microsoft Internet Explorer®.

As an additional refinement, the communications channel from the microprocessor 62 of the local monitoring device 10 to the central processing facility 110 may be bi-directional so that the information maintained and stored in the microprocessor 62 may be sent out on a scheduled basis or may be polled. Furthermore, through bi-directional communications, the microprocessor 62 is remotely re-programmable.

Returning to the computational analysis performed at the central processing facility 110, once the requisite data has been collected and transmitted to the central processing facility 110, the data is used lo computationally estimate the amount of electric power being transmitted over the transmission line associated with the collected data. More specifically, for any particular transmission line, certain of the variables that govern the electric potential and magnetic field vectors measured by the sensors are constants, independent of the amount of electric power, flowing on the lines. For each transmission line, it is possible to ascertain the line voltage ratings and insulative properties from either direct observation or publicly available information. Simple measurements accomplished with a visual measuring device such as a laser range-finder are used to determine the spatial arrangement of the conductors with respect to each other and with respect to the measurement point. In this regard, it is understood that measurements may be affected by slight changes in variables, such as temperature and power flow on the transmission lines; however, appropriate corrections can be made computationally. The only required variables that are not constants, independent of time, are the amount of current flowing over each of the three conductors and the direction of electric power flow. The data provided by the monitoring device enables these variables to be calculated.

Specifically, with the data provided from the monitoring device, the magnitude and direction of the electric power flowing through a given transmission line, along with the real and reactive components of that power, can be determined through a computational analysis preferably carried out using a digital computer program.

The horizontal and vertical magnetic field components calculated in the analysis component depend linearly on the line currents, albeit with complex coefficients. That is, the horizontal magnetic field component can be represented by a complex number (a phasor) that is a linear combination of the horizontal magnetic field contributions caused by each of the three conductors of the three-phase transmission line, with the coefficients of combination being complex numbers determined from the geometrical arrangement of the conductors and the sensor location with respect to the conductors. In other words, there results n complex simultaneous linear equations in n complex unknowns with n squared complex coefficients. Such a set of equations is invertible (i.e., it may be solved by a number of means, such by the use of Cramer's Rule or by Gaussian elimination) and is solved analytically. Given perfect measurements (or actual measurements, perfectly corrected) the real and imaginary components of the electric power on the line are determined exactly.

The preferred method of computational analysis has two components. The first component of the computational analysis is run off-line. It consists of computation of the complex coefficients of the above-referenced set of simultaneous linear equations which define the geometrical arrangement of the conductors and the sensor location with respect to the conductors, followed by inversion of the coefficient matrix. These results are stored in a database. This first component of the computational analysis needs to be performed only once for a given installation of a monitoring device with respect to a particular transmission line.

The second component is run on-line. It corrects the measured phase angle for sensor errors and geometrically induced errors to get actual horizontal and vertical magnetic field values, and multiplies the resulting measurement vector by the inverted coefficient matrix referred to above to determine line current and phase angle. In this regard, the sensed phase angle differs from the phase angle on the transmission line in a very complicated way, being affected by: the geometrical relationships between the conductors of the transmission line and the location of the monitoring device in three-dimensional space; sag of the transmission line; and the inherent minor inaccuracies of the sensors and their associated electronics. Nevertheless, many, if not all, of the resulting errors can be calculated and compensated for, leading to a computational estimate of the power factor on the line. Since the phase angle on the transmission line is calculated, and the real and reactive powers are calculated as signed quantities, the direction of flow of both the real and the imaginary components of the apparent power can be determined as well.

Method of Computation

Using the monitoring device 10 of the present invention as described above, measurements of the generated magnetic field can be determined, which then allows for a determination of the power on the transmission line in question through careful application of known mathematical algorithms to the field data collected. As an example of the method, consider a typical application consisting of a single transmission line comprised of three conductors (or phases). For purposes of the calculation, it is assumed that the transmission line is oriented parallel to a flat, perfectly conducting Earth.

The magnitude of the magnetic field intensity H generated by an infinitely long, straight conductor is governed by the equation:

$$H = \frac{I}{2\pi r} \text{ Amp/m} \qquad (1)$$

where I is the current flowing through the conductor, and r is the distance from the conductor to the point at which the magnetic field intensity is being measured. It is somewhat more common to refer to the strength of a magnetic field in terms of the magnetic flux density B. The magnetic flux density is defined as:

$$B = \mu_0 H \text{ Webers/m}^2 \qquad (2)$$

where $\mu_0 = 4\pi \times 10^{-7}$ H/m, a constant—the permeability of free space. Since 1 Wb/m$^2$=10,000 gauss:

$$B = \frac{4\pi \times 10^7 I}{2\pi r} \frac{\text{Weber}}{\text{m}^2} \times \frac{10^2 \text{ gauss}}{\text{Wb/m}^2} \times \frac{10^3 \text{ milligauss}}{\text{gauss}} \qquad (3)$$

which reduces to the simple formula:

$$B = \frac{2I}{r} \text{ Milligauss} \qquad (4)$$

Accordingly, this formula can be used to determine the magnetic flux density B in milligauss at a distance r (measured in meters) from an infinitely thin conductor carrying I Amperes of electrical current.

For example, at a distance of r=50 feet=15.244 meters from a conductor carrying a current of I=100 Amperes, the magnetic flux density is:

$$B = \frac{2I}{R} = \frac{2(100)}{15.244} = 13.12 \text{ milligauss} \qquad (5)$$

Since H is a spatial vector, B is also a spatial vector. For this reason, the direction of the magnetic flux density B is perpendicular to a line drawn from the measurement point to the nearest point on the conductor. According to the familiar "right-hand rule" for determining direction, if the current is directed toward the viewer, the magnetic flux lines are directed counter-clockwise, giving a magnetic flux density vector B directed as shown in FIG. 7.

Figure 7:
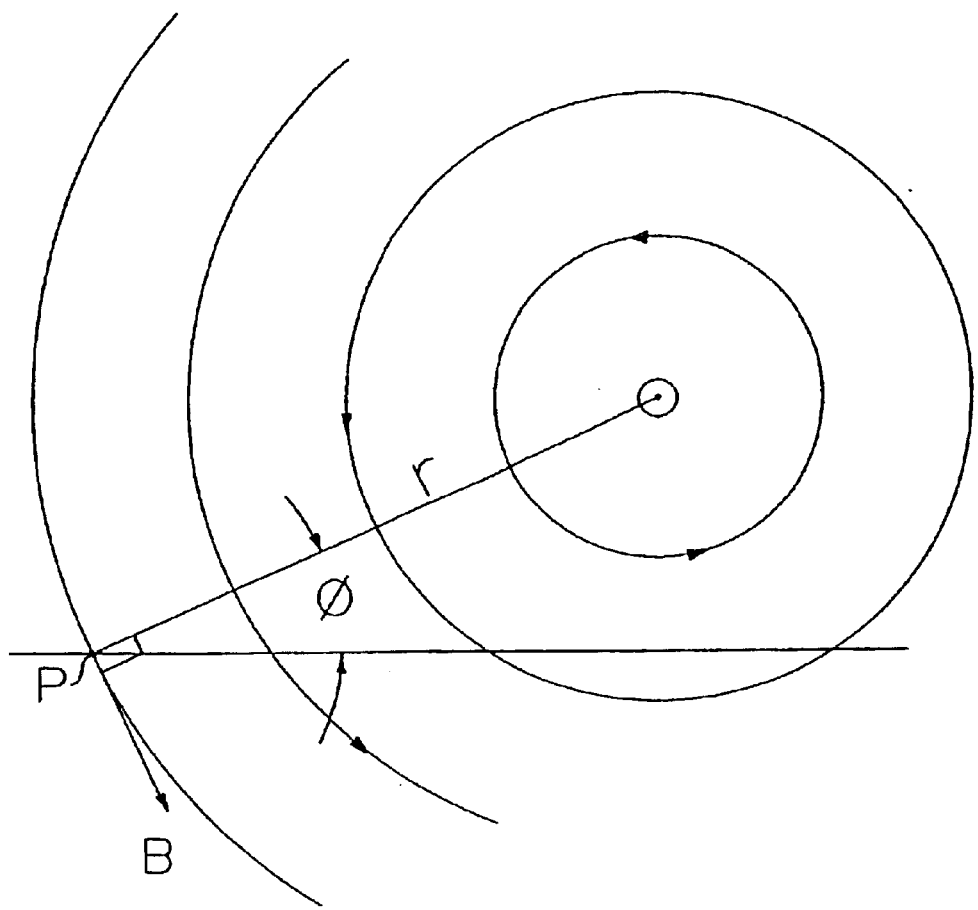
FIG. 7 is a schematic representation of magnetic flux associated with a conductor through which current passes.

Also, as shown in FIG. 7, the angle φ is the angle between r (the line drawn from the measurement point P and the conductor) and the positive x-axis. Since B is perpendicular to r, the spatial vector B can be resolved into its horizontal and vertical components $B_X$ and $B_Y$. For a single conductor carrying direct current (DC), the x and y components are simply determined by:

$$B_X = B \sin \phi \qquad (6)$$

$$B_Y = -B \cos \phi \qquad (7)$$

For a three-phase alternating current (AC) electric power transmission line, there are three conductors, carrying currents that are 120° apart in time phase. The time relationship between the currents may be represented by phasors, as in standard AC circuit analysis.

Figure 8:
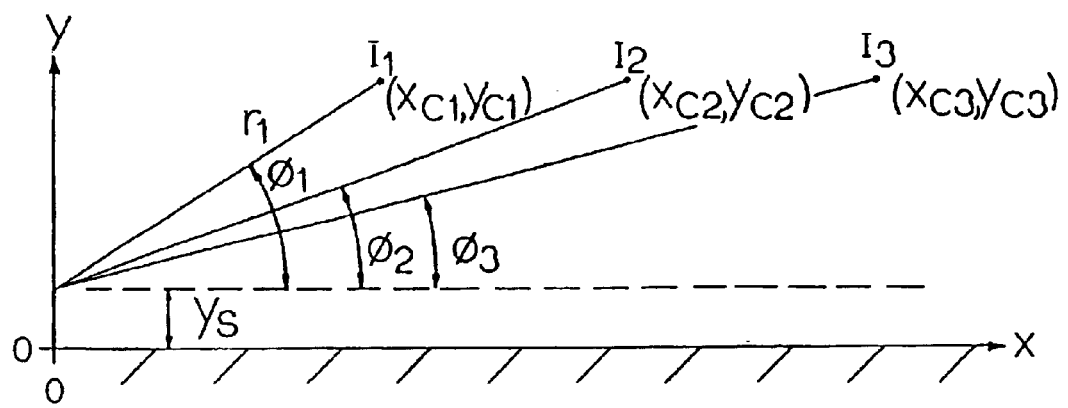
FIG. 8 is a schematic representation showing the phasor relationship between the unit phasor components present in an infinitely long, three-phase electric power transmission line.

FIG. 8 is a diagram showing the phasor relationship between the unit phasor components present in an infinitely long, three-phase transmission line over the flat Earth. Mathematically:

$$I_1 = Io\, A \tag{8}$$

$$I_2 = Io\, B \tag{9}$$

$$I_3 = Io\, C \tag{10}$$

where Io is the (signed) RMS amplitude of the current on each conductor, and A, B, and C are unit phasors chosen to be 120° apart, as follows:

$$A = 1.0 = j0.0 \tag{11}$$

$$B = -0.5 - j0.866 \tag{12}$$

$$C = -0.5 + j0.866 \tag{13}$$

The magnetic flux density phasor caused by the phasor current in each conductor may then be calculated by:

$$B_1 = \frac{2IoA}{r_1} \tag{14}$$

$$B_2 = \frac{2IoB}{r_2} \tag{15}$$

$$B_3 = \frac{2IoC}{r_3} \tag{16}$$

Each of the three magnetic flux densities calculated in equations (14), (15), and (16) has a horizontal and a vertical component. Accordingly, the horizontal and vertical components of the three-phase transmission line, as shown in FIG. 8 and which are analogous to the vector components of a single phase line as per equations (6) and (7) above, may be calculated as follows:

$$B_{1x} = B_1 \sin\phi_1 = \frac{2IoA}{r_1} \sin\phi_1 \tag{17}$$

$$B_{1y} = -B_1 \cos\phi_1 = \frac{-2IoA}{r_1} \cos\phi_1 \tag{18}$$

$$B_{2x} = B_2 \sin\phi_2 = \frac{2IoB}{r_2} \sin\phi_2 \tag{19}$$

$$B_{2y} = -B_2 \cos\phi_2 = \frac{-2IoB}{r_2} \cos\phi_2 \tag{20}$$

$$B_{3x} = B_3 \sin\phi_3 = \frac{2IoC}{r_3} \sin\phi_3 \tag{21}$$

$$B_{3y} = -B_3 \cos\phi_3 = \frac{-2IoA}{r_3} \cos\phi_3 \tag{22}$$

Referring again to FIG. 8, the x and y coordinates of the three conductors of a three-phase transmission line may be designated as $(x_{c1}, y_{c1})$, $(x_{c2}, y_{c2})$, $(x_{c3}, y_{c3})$ respectively. As shown, the geometric distances and respective angles in equations (17) through (22) may be calculated by:

$$r_1 = \sqrt{\{(x_{c1}-x_s)^2 + (y_{c1}-y_s)^2\}} \tag{23}$$

$$r_2 = \sqrt{\{(x_{c2}-x_s)^2 + (y_{c2}-y_s)^2\}} \tag{24}$$

$$r_3 = \sqrt{\{(x_{c3}-x_s)^2 + (y_{c3}-y_s)^2\}} \tag{25}$$

and $$\phi_1 = \tan^{-1}\{(y_{c1}-y_s)/(x_{c1}-x_s)\} \tag{26}$$

$$\phi_2 = \tan^{-1}\{(y_{c2}-y_s)/(x_{c2}-x_s)\} \tag{27}$$

$$\phi_3 = \tan^{-1}\{(y_{c3}-y_s)/(x_{c3}-x_s)\} \tag{28}$$

The horizontal (x) and vertical (y) spatial components as determined in equations (17) through (22) may be superposed, yielding expressions for the horizontal magnetic flux density ($B_H$) and the vertical magnetic flux density ($B_V$) at the measurement location as:

$$B_H = 2Io\left(\frac{A}{r_1}\sin\phi_1 + \frac{B}{r_2}\sin\phi_2 + \frac{C}{r_3}\sin\phi_3\right) \tag{29}$$

$$B_V = -2Io\left(\frac{A}{r_1}\cos\phi_1 + \frac{B}{r_2}\cos\phi_2 + \frac{C}{r_3}\cos\phi_3\right) \tag{30}$$

Equations (29) and (30) have been derived under the assumption that the current on the first conductor line 1 (phase 1) is governed by equation (3), that is:

$$I_1 = Io\, A \tag{31}$$

where Io is a scalar element, which may be either positive or negative. In fact, the current on the first conductor may have any phase relationship. Its phase has meaning only with respect to some well-defined phase reference, which will be defined below as the phase of the voltage on the first conductor. In other words, Io is not a scalar, but rather is also a phasor and is hereinafter denoted by Io, where $$Io = Io < \phi \tag{32}$$

Accordingly, equation (31) becomes:

$$I_1 = Io\, A \tag{33}$$

with $$Io = |Io| \tag{34}$$

In this same respect, equations (29) and (30) must be suitably modified as well:

$$B_H = 2Io\left(\frac{A}{r_1}\sin\phi_1 + \frac{B}{r_2}\sin\phi_2 + \frac{C}{r_3}\sin\phi_3\right) \tag{35}$$

$$B_V = -2Io\left(\frac{A}{r_1}\cos\phi_1 + \frac{B}{r_2}\cos\phi_2 + \frac{C}{r_3}\cos\phi_3\right) \tag{36}$$

Some interpretation is now in order. A, B, C, $r_1$, $r_2$, $r_3$, $\phi_1$, $\phi_2$, and $\phi_3$ are known constants which are either defined or determined from the geometry of the line arrangement. Equations (35) and (36) can therefore be re-written as:

$$B_H = a_1 Io \tag{37}$$

$$B_v = a_2 Io \tag{38}$$

where $$a_1 = 2\left(\frac{A}{r_1}\sin\theta_1 + \frac{B}{r_2}\sin\phi_2 + \frac{C}{r_3}\sin\phi_3\right) \tag{39}$$

$$a_1 = -2\left(\frac{A}{r_1}\cos\theta_1 + \frac{B}{r_2}\cos\phi_2 + \frac{C}{r_3}\cos\phi_3\right) \quad (40)$$

$a_1$ and $a_2$ are complex constants depending on the line geometry and equations (37) and (38) state that the horizontal and vertical magnetic flux densities $B_H$ and $B_v$, as phasors, may be obtained by multiplying the complex phasor current Io by $a_1$ and $a_2$, respectively.

These are linear relationships. Both equations (37) and (38) constitute one equation in one unknown, albeit with a complex given phasor ($B_H$), complex coefficient ($a_1$), and complex unknown phasor (Io).

With one linear equation in one unknown, the equation is solvable. Solving for Io from (37) and (38):

$$Io = B_H/a_1 \quad (41)$$

$$Io = B_v/a_2 \quad (41)$$

The above calculations indicate that, in principle, the phasor Io, in both magnitude and angle, can be determined from a measurement of the horizontal component of the magnetic flux density $B_H$, or from measurement of the vertical component of the magnetic flux density $B_v$ by dividing by the appropriate complex number ($a_1$ or $a_2$).

Accordingly, only one measurement—of either $B_H$ or $B_v$—is sufficient to determine Io, to within an arbitrary phase shift. That is, from one measurement, one can determine apparent power, but not the distribution of apparent power between the real power (MW) and the reactive power (MVars). Since real and reactive power are each a signed quantity, the direction of power flow can not be determined unless the phase indeterminacy can be resolved.

A Numerical Example

Figure 9:
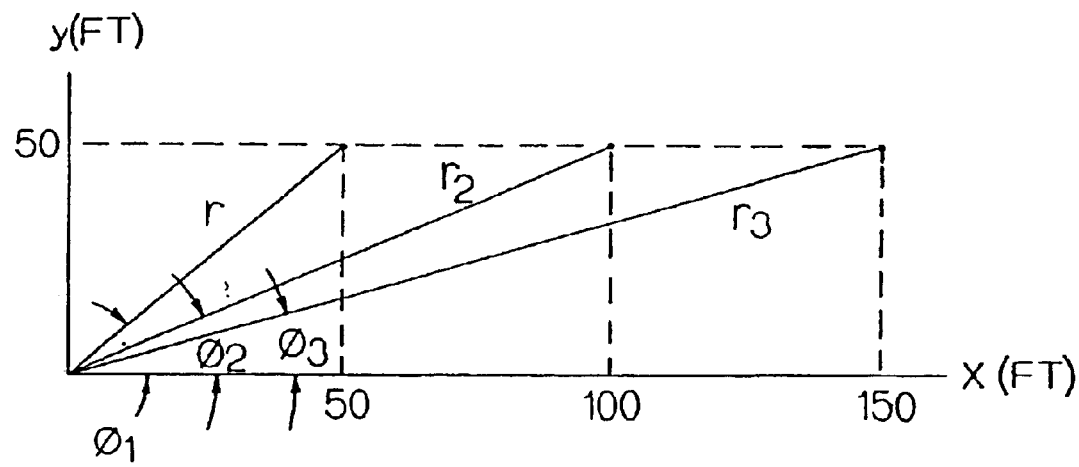
FIG. 9 is a schematic representation of an exemplary three-phase electric power transmission line geometry with a pair of magnetic field sensors located at ground level for measuring the magnetic flux density associated with the transmission line.

FIG. 9 is an example of a line geometry with a pair of magnetic field sensors 18', 20' located at ground level. The sensors 18', 20' are located fifty feet below the level of the power lines, and fifty feet lateral of the first phase of the line. In this example, fifty feet separate the conductors from one another. Solving for the distance and angle parameters:

$$r_1 = \sqrt{(50^2+50^2)} = 70.7 \text{ ft.} \quad (43)$$

$$r_2 = \sqrt{(100^2+50^2)} = 111.8 \text{ ft.} \quad (44)$$

$$r_3 = \sqrt{(150^2+50^2)} = 158.1 \text{ ft.} \quad (45)$$

$$\phi_1 = \tan^{-1}(50/50) = 45.0° \quad (46)$$

$$\phi_2 = \tan^{-1}(50/100) = 26.56° \quad (47)$$

$$\phi_3 = \tan^{-1}(50/150) = 18.43° \quad (48)$$

$r_1$, $r_2$, and $r_3$ must be in meters, therefore:

$$r_1 = 70.7/3.28 = 21.56 \text{ meters} \quad (49)$$

$$r_2 = 111.8/3.28 = 34.09 \text{ meters} \quad (50)$$

$$r_3 = 158/3.28 = 48.20 \text{ meters} \quad (51)$$

$$\sin\phi_1 = \sin(45.0°) = 0.707 \quad (52)$$

$$\sin\phi_2 = \sin(26.56°) = 0.447 \quad (53)$$

$$\sin\phi_3 = \sin(18.43°) = 0.316 \quad (54)$$

$$\cos\phi_1 = \cos(45.0°) = 0.707 \quad (55)$$

$$\cos\phi_2 = \cos(26.56°) = 0.8944 \quad (56)$$

$$\cos\phi_3 = \cos(18.43°) = 0.949 \quad (57)$$

Then substituting into Equations (35) and (36) yields:

$$B_H = 2Io\left(A\frac{(0.707)}{(21.56)} + B\frac{(0.8944)}{(34.09)} + C\frac{(0.949)}{(48.20)}\right) \quad (58)$$

$$B_V = -2Io\left(A\frac{(0.707)}{(21.56)} + B\frac{(0.447)}{(34.09)} + C\frac{(0.316)}{(48.20)}\right) \quad (59)$$

Assuming, $$Io = 1000<0° = 1000+j0 \text{ Amps} \quad (60)$$

and A, B, and C are as given in equations (11), (12), and (13), we have:

$B_H = 0.065584(1000+j0) + 0.052473(-500-j866) + 0.039378(-500+j866) = 65.58 - 26.2365 - j45.441618 - 19.689+j341$ $$B_H = 19.6545 - j11.34 = 22.692<-29.98° \quad (61)$$

$B_v = -[0.065584(1000+j0) + 0.026225(-500-j866) + 0.013112(-500+j866)] = -[65.584 - 13.1125 - j22.711 - 6.556+j11.355]$ $$B_v = -45.9155 + j11.3656 = 47.299<166.108° \quad (62)$$

Since $B_H$ and $B_v$ have neither the same phase, nor are they 180° different in phase, the magnetic flux density is elliptically polarized, a well-known property of the magnetic field around three-plase power lines.

The above numerical example predicts that, for the geometry shown in FIG. 9, the magnetic flux density at the origin would have a horizontal component of 22.692 milligauss and a vertical component of 47.299 milligauss. Further, with Io=1000<0°, we have:

$$B_H = 22.692<-29.98° \quad (63)$$

This result may be interpreted as meaning that the phase of the measured horizontal magnetic flux density (-29.98°) is approximately the same as the phase of the first conductor (0°), with a rather large 29.98° error. However, since the 29.98° error depends only on the geometry of the conductor arrangement, it can be calculated and accounted for.

Referring again to equations (39) and (40):

$$a_1 = \left((1+j0)\frac{(0.707)}{(21.56)} + (-0.5-j0.866)\frac{(0.8944)}{(34.09)} + (-0.5-j0.866)\frac{(0.949)}{(48.20)}\right) = 0.022692 \angle -29.98° \quad (64)$$

and $$a_2 = -2\left((1+j0)\frac{(0.707)}{(24.56)} + (-0.5-j0.866)\frac{(0.447)}{(34.09)} + (-0.5-j0.866)\frac{(0.316)}{(48.20)}\right) = 0.047299 \angle 166.11° \quad (65)$$

Accordingly, with the measurements of $B_H$ and $B_v$ as those calculated in the above example, it is possible to invert the signs to determine Io from the measurements as indicated by equations (42) and (42). Specifically, from a measurement of $B_H = 22.692<-29.98°$ and the application of equation (41):

$$Io = B_H/a_1 = \frac{22.692 \angle 29.98°}{0.022692 \angle -29.98°} = 1000 \angle 0° \quad (66)$$

From a measurement of $B_V$=47.299 $\angle$166.108° and the application of equation (42):

$$Io = B_V/a_2 = \frac{47.299 \angle 166.108°}{0.047299 \angle 166.108°} = 1000 \angle 0° \quad (67)$$

which demonstrates the earlier assertion that Io may be determined from either the measurement of $B_H$ or the measurement of $B_V$. The same answer is obtained in either case.

Another very frequent arrangement used by many utilities is to place two parallel three-phase circuits on a single tower structure. Such a scenario can essentially be handled by the same method, except that both $B_H$ and $B_V$ must be used, and a set of two simultaneous equations in two unknowns and involving four complex coefficients must be solved mathematically. However, it is first necessary to demonstrate how the phase indeterminacy in the above analysis can be removed.

Electric Potential Sensor Analysis

The discussion immediately following equation (63) may be thought of as demonstrating that the output voltage of a magnetic field sensor constitutes a remote measurement of both the magnitude and the phase of the current on the first conductor. However, the phase of the current has value only when compared to the phase of the voltage on the line, since the real and reactive power are given by:

$$MW = V_L I_L \cos\phi \quad (68)$$

$$MVAR = V_L I_L \sin\phi \quad (69)$$

where $V_1$ is the line voltage, $I_1$, is the line current, and $\phi$ is the difference between the phase of the line voltage and the phase of the line current. Therefore, the phase of the voltage on the line must be determined as well.

Figure 10:
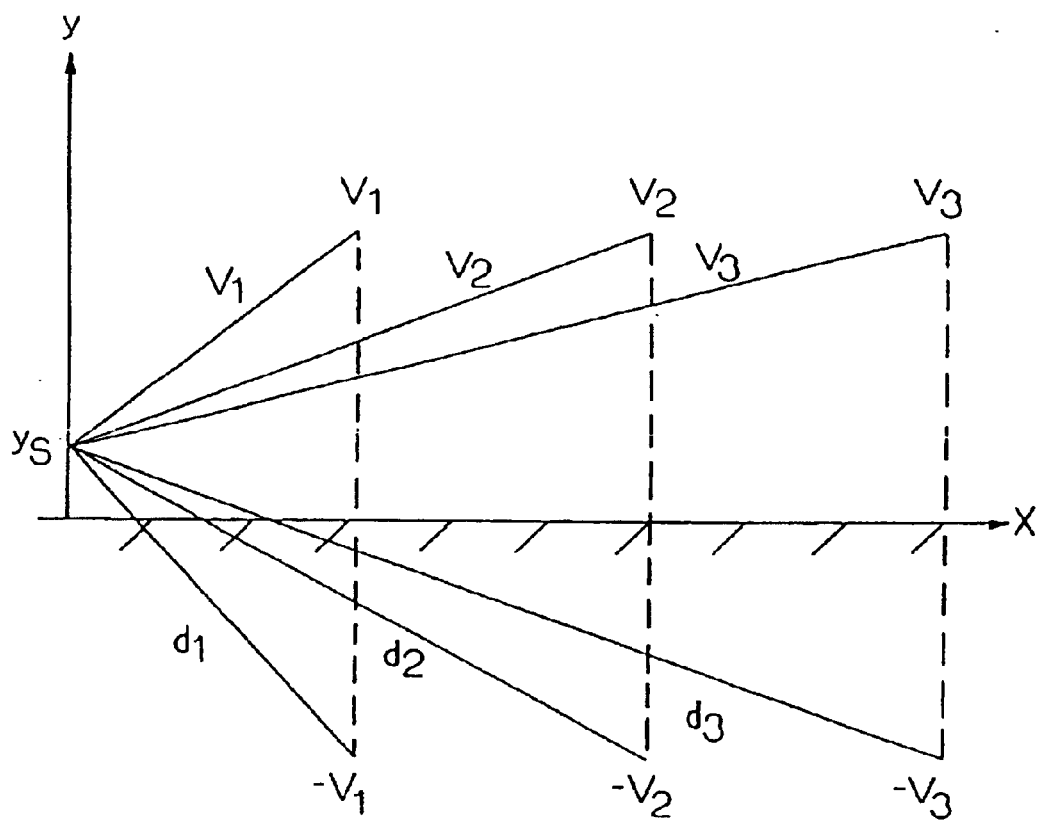
FIG. 10 is a schematic representation of the three conductors of a three-phase electric power transmission line, with an electric potential sensor located a predetermined distance above ground level for measuring the electric potential associated with the transmission line.

FIG. 10 shows the three conductors of a three-phase electric power transmission line, with an electric potential sensor 16' located distance $y_s$ above the Earth. Assuming the Earth to be a flat, perfectly conducting ground plane, the electric field in the region above the Earth may be determined by adding a set of image conductors symmetrically placed with respect to the x-axis, each with the opposite sign of the voltage when compared to the real conductors above ground. Thus, the voltage on the first conductor is $V_1$, while the voltage on its image conductor is $-V_1$. The second and third conductors are imaged in the same manner.

Figure 11:
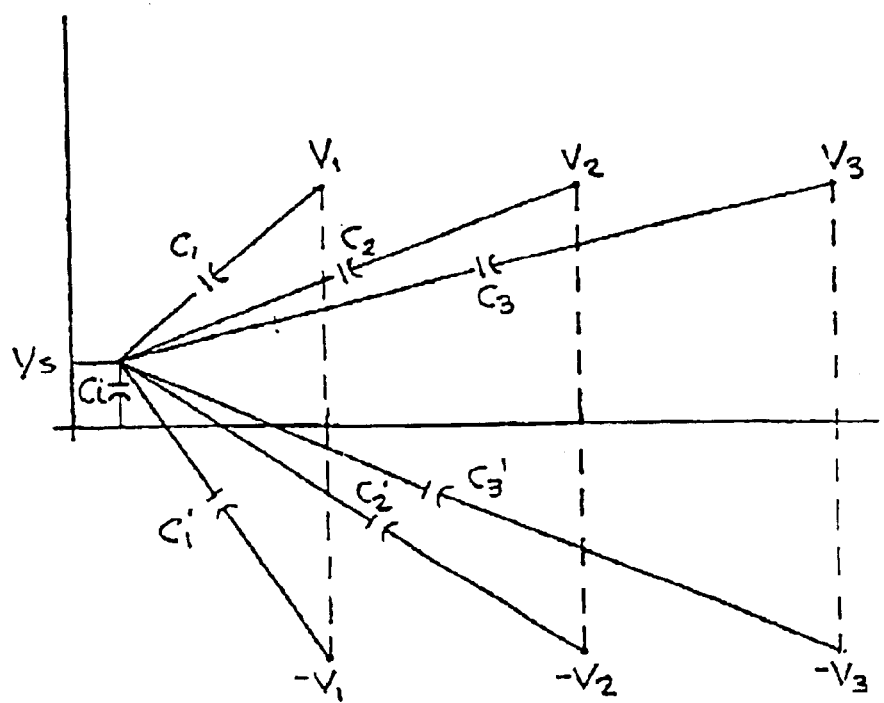
FIG. 11 is a schematic representation showing the capacitances resulting from the interaction between the conductors of a three-phase electric power transmission line and an electric potential sensor.

The electric potential sensor 16' itself is a metal plate oriented roughly perpendicular to the line of sight from the sensor location at coordinates (0, $y_s$) to the average position of the transmission line conductors. Any given transmission line conductor, together with the metal plate 16', constitute two pieces of conducting material with an insulator (air) in between. In that sense, the transmission line conductor and the metal plate 16' form a capacitor, which is defined as two conducting objects separated by, or immersed in, a dielectric medium. Therefore, there. exists a capacitance between each conductor (including the image conductors) and the electric potential sensor 16'. The electric potential sensor 16' is connected to ground through a conventional electrical capacitor Ci, forming an electrical circuit, an example of which is shown in FIG. 11.

Although the geometry is complex, the capacitances involved here may be approximated by use of the standard formula for the capacitance of a parallel plate capacitor, which is:

$$C = \frac{\epsilon A}{d} \quad (70)$$

where $\epsilon_o$=8.854×10$^{-12}$ Farads/m, a constant—the permitivity of free space. A is the area of the plate in square meters, and d is the plate separation in meters. Although equation (70) applies only for two finite area plates of large extent compared to their separation (so that fringing may be neglected), it may be used to approximate the size of the capacitances shown in FIG. 11.

For example, assume that $r_1$=70.7 ft=21.56 m and the plate area is A=0.1 square meters. Further assuming that the other plate, i.e., the transmission line conductor, has the same effective area. Then, $$C_1 = \frac{\epsilon oA}{d} = \frac{8.854 \times 10^{-12}(0.1)}{21.56} = 4.11 \times 10^{-14} \text{ Farads} \quad (71)$$

or $$C_1 = 0.0411 \times 10^{-12} = 0.0411 \text{ pF}.$$

Thus, the capacitances involved in FIG. 11 are very small by normal standards, but nevertheless the capacitances are real.

The electric potential sensor 16' cannot be placed at ground level because, at ground level, the electric potential is zero due to complete cancellation of the fields produced by the real conductors with those produced by the image conductors. The distance calculations of equations (43) through (45) must accordingly be revised according to the more general expressions of equations (23) through (25):

$$r_1 = \sqrt{[(x_{c1}-x_s)^2+(y_{c1}-y_s)^2]} = \sqrt{[(50-0)^2+(50-4)^2]} = 67.94 \text{ ft} \quad (72)$$

$$r_2 = \sqrt{[(x_{c2}-x_s)^2+(y_{c2}-y_s)^2]} = \sqrt{[(100-0)^2+(50-4)^2]} = 110.07 \text{ ft} \quad (73)$$

$$r_3 = \sqrt{[(x_{c3}-x_s)^2+(y_{c3}-y_s)^2]} = \sqrt{[(150-0)^2+(50-4)^2]} = 156.89 \text{ ft} \quad (74)$$

$$d_1 = \sqrt{[(x_{c1}-x_s)^2=(y_{c1}+y_s)^2]} = \sqrt{[(50-0)^2+(50+4)^2]} = 73.59 \text{ ft} \quad (75)$$

$$d_2 = \sqrt{[(x_{c2}-x_s)^2=(y_{c2}+y_s)^2]} = \sqrt{[(100-0)^2+(50+4)^2]} = 113.65 \text{ ft} \quad (76)$$

$$d_3 = \sqrt{[(x_{c3}-x_s)^2=(y_{c3}+y_s)^2]} = \sqrt{[(150-0)^2+(50+4)^2]} = 159.42 \text{ ft} \quad (77)$$

Converted to meters:

$$r_1 = 67.94/3.28 = 207.1 \text{ m} \quad (78)$$

$$r_2 = 110.07/3.28 = 33.56 \text{ m} \quad (79)$$

$$r_3 = 156.89/3.28 = 47.83 \text{ m} \quad (80)$$

$$d_1 = 73.59/3.28 = 22.44 \text{ m} \quad (81)$$

$$d_2 = 113.65/3.28 = 34.65 \text{ m} \quad (82)$$

$$d_3 = 159.42/32.8 = 48.60, \quad (83)$$

Then, assuming A=0.10 square meters, the capacitances shown in FIG. 11 may be estimated:

$$C_1 = \frac{\epsilon oA}{r_1} = \frac{8.854 \times 10^{-12}(0.1)}{20.71} = 0.0428 \text{ pF} \quad (84)$$

-continued $$C_2 = \frac{\epsilon_o A}{r_2} = \frac{8.854 \times 10^{-12}(0.1)}{33.56} = 0.0264 \text{ pF} \quad (85)$$

$$C_3 = \frac{\epsilon_o A}{r_3} = \frac{8.854 \times 10^{-12}(0.1)}{47.83} = 0.0185 \text{ pF} \quad (86)$$

$$C'_1 = \frac{\epsilon_o A}{d_1} = \frac{8.854 \times 10^{-12}(0.1)}{22.44} = 0.0395 \text{ pF} \quad (87)$$

$$C'_2 = \frac{\epsilon_o A}{d_2} = \frac{8.854 \times 10^{-12}(0.1)}{34.64} = 0.0256 \text{ pF} \quad (88)$$

$$C'_3 = \frac{\epsilon_o A}{d_3} = \frac{8.854 \times 10^{-12}(0.1)}{48.60} = 0.0182 \text{ pF} \quad (89)$$

Figure 12:
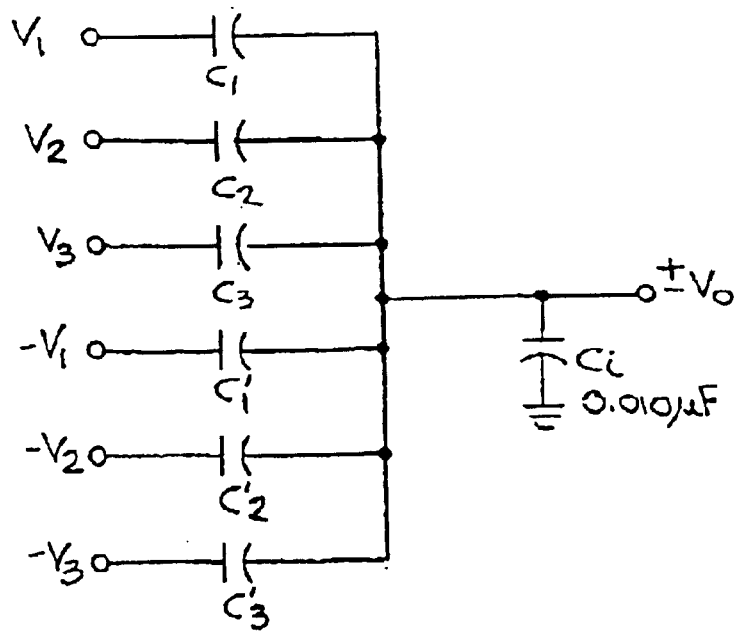
FIG. 12 is a typical circuit diagram explaining the relationship of the capacitances shown in FIG. 11.

In FIG. 12, a traditional circuit diagram of this arrangement is shown, assuming that the capacitance Ci has been chosen to be Ci=0.01 $\mu$F.

Therefore, the phasor output voltage of the circuit of FIG. 6 is:

$$\begin{aligned} V_0 &= C_1 V_1 / Ci + C_2 V_2 / Ci + C_3 V_3 / Ci - C'_1 V_1 / Ci - \\ &\quad C'_2 V_2 / Ci - C'_3 V_3 / Ci \\ &= (C_1 - C'_1) V_1 / Ci + (C_2 - C'_2) V_2 / Ci + (C_3 - C'_3) V_3 / Ci \\ &= (0.0428 - 0.0395) \times 10^{-12} V_1 / 0.01 \times 10^{-6} + \\ &\quad (0.0264 - 0.0256) \times 10^{-12} V_2 / 0.01 \times 10^{-6} + \\ &\quad (0.0185 - 0.0182) \times 10^{-12} V_3 / 0.01 \times 10^{-6} \\ &= 0.0033 \times 10^{-12} V_1 / 0.01 \times 10^{-6} + \\ &\quad 0.0008 \times 10^{-12} V_2 / 0.01 \times 10^{-6} + \\ &\quad 0.0003 \times 10^{-12} V_3 / 0.01 \times 10^{-6} \\ &= 0.33 \times 10^{-6} V_1 + 0.08 \times 10^{-6} V_2 + 0.03 \times 10^{-6} V_3 \end{aligned} \quad (90)$$

Thus, the capacitive divider output is a highly attenuated linear combination of the line-to-ground voltages appearing on each of the three phases of the electric power transmission line.

For example, if the line-to-line voltage of the circuit is $V_{LL}$=345 kV, then the magnitude of the line-to-ground voltage is $V_{LG}$=345/√3=199.19 kV, and $$V_1 = 199 \times 10^3 < 0° = 199 \times 10^3 (1+j0) \quad (91)$$

$$V_2 = 199 \times 10^3 < -120° = 199 \times 10^3 (-0.5-j0.866) \quad (92)$$

$$V_3 = 199 \times 10^3 < +120° = 199 \times 10^3 (-0.5-j0.866) \quad (93)$$

and substitution into equation (90) yields:

$$\begin{aligned} V_0 &= 0.33 \times 10^{-6}[199 \times 10^3 (1+j0)] + 0.08 \times 10^{-6}[199 \times 10^3 (-0.5-j0.866)] + \\ &\quad 0.03 \times 10^{-6}[199 \times 10^3 (-0.5+j0.866)] \\ &= 0.06567(1+j0) + 0.01592(-0.5-j0.866) + 0.00597(-0.5+j0.866) \\ &= (0.06567 - 0.00796 - 0.002985) - j(0.01387 - 0.00517) \\ &= 0.054725 - j0.00862 \\ &= 0.0554 < -8.95° \end{aligned} \quad (94)$$

The voltage developed across the capacitor Ci has a magnitude of 55.4 mv, with a phase angle of −8.95°. However, since the voltage in the first conductor was assumed to have a phase angle of 0°, the output voltage of the capacitive divider not only provides a voltage whose magnitude is proportional to the magnitude of the line-to-line voltage on the electric power transmission line, but whose phase is approximately the phase of the voltage on the first conductor, the nearest conductor in this example. The error in measuring the phase of the line-to-ground voltage on the first conductor (−8.95° in this case) is dependent only on the geometry of the line conductor with respect to the monitoring device 10' location. Therefore, it may be calculated and corrected for if the geometry is known.

Remote Determination of Power Factor on an Electric Power Transmission Line

As described with respect to equation (63), if the current on the first conductor was $I_o$=100<0° Amperes, the magnetic field sensor 18' output was $$B_H = 22.692 < -29.98° \quad (95)$$

And, as determined in equation (94), the output voltage of the electric potential sensor 16' is $$V_o = 0.0554 < -8.95 \quad (96)$$

Thus, the output of the electric potential sensor 16' lags the voltage in the first conductor by 8.95°, and the output voltage of the magnetic field sensor 18' lags the current through the first conductor by 29.98°. Assuming that the phase angle on the transmission line is $\theta_L$ degrees, so that $I_o$=1000<$\theta_L$, the magnetic field sensor output would be:

$$B_H = 22.692 < \theta_L - 22.698° \quad (97)$$

and the angle $H_a$ between the electric potential sensor output $V_o$ and the magnetic flux density $B_H$ would be $$H_a = <V_o - <B_H = -8.95° - (\theta_L - 22.698°) = (22.6980° - 8.95°) - \theta_L \quad (98)$$

And, therefore:

$$\theta_L = -H_a + (22.698° - 8.95°) \quad (99)$$

Thus, from a measurement of $H_a$, the difference of the phases of the two experimentally observable signals $V_o$ and $B_H$, the phase angle $\theta_L$ in the transmission line can be obtained by correcting this difference by adding the difference of the two sensor errors—and these may be computed a priori from the geometrical arrangement of the sensors with respect to the transmission line conductors.

For example, if $H_a$ is measured as +45°, then from equation (99):

$$\theta_L = -45° + (22.698° - 8.95°) = -31.252° \quad (100)$$

so that the power factor on the line is $$PF = \cos \theta_L = 0.855 \quad (101)$$

and the power per phase is $$P_{phase} = V_{LG} |I_o| \cos \theta_L = (199 \times 10^3)(1000)(0.855) = 170.145 MW \quad (102)$$

so that the total transmission line power is $$MW = 3P = 510.435 \text{ megawatts} \quad (103)$$

and the reactive power on the line is $$MVAR = 3[V_{LG} |I_o| \sin \theta_L] = 3[199 \times 10^3(1000)(-0.519)] = -309.843 MVAR \quad (104)$$

The algebraic sign of the above quantities if vitally important. For the coordinate system defined in FIGS. 7–11, positive values for real (MW) and reactive power (MVAR) correspond to power flow out, parallel to the monitoring device 10', from left to right past the monitoring device 10' if the transmission line is viewed from behind the monitoring device 10'. For the above example, 510 megawatts of real power is flowing to the right, and 310 megawatts of reactive power is flowing to the left with respect to the monitoring device 10.

Since the essential objective of the present invention is to determine by remote sensors, the total power output of an electric power generating plant, accurate determination of the direction of the power flow on a line is as important as determination of the magnitude of the power flow. Specifically, it is necessary to distinguish between the electric power coming out of an electric power generation plant and the power going in.

Sensor Blending Generalizations and Alternate Mechanizations

Thus, as fully described above, with an electric potential sensor and at least one magnetic field sensor, it is possible to remotely (i.e., by non-contacting means) determine both the magnitude and direction of the power flow on a three-phase electric power transmission line. With two magnetic field sensors, one measuring the horizontal magnetic flux density $B_H$ and one measuring the vertical magnetic flux density $B_v$, two independent estimates of the line current, and hence, the real power (MW) and the reactive power (MVAR), may be determined. These may be combined in a variety of ways to produce a more accurate estimate of MW and MVAR than that obtainable from either taken separately. In particular, if $MW_H$ and $MVAR_H$ represent the power flow results from the horizontal magnetic flux density measurements, and $MV_v$ and $MVAR_v$ are from the vertical magnetic flux density measurements, then $$MW = w_1 MW_H + w_2 MWV \tag{105}$$

$$MVAR = w_1 MVAR_H + w_2 MVAR_v \tag{106}$$

where $w_1$ and $w_2$ are weighting factors which may be chosen to blend the different measurements in several ways, depending on which measurements are thought to be most accurate. If the horizontal and vertical measurements are equally accurate, then $w_1 = w_2 = 0.5$ is appropriate, giving:

$$MW = 0.5 MW_H + 0.5 MW_v = (MW_H + MW_v)/2 \tag{107}$$

$$MVAR = 0.5 MVAR_H + 0.5 MVAR_v = (MVAR_H + MVAR_v)/2 \tag{108}$$

In this case, the average of the horizontal and vertical measurements provides a more accurate measurement than that provided by either measurement taken alone.

Alternatively, if small magnetic fields produce noisier measurements, the weighting factors can be defined as:

$$w_1 = |B_H|/(|B_H| + |B_v|) \tag{109}$$

$$w_2 = -|B_v|/(|B_H| + |B_v|) \tag{110}$$

which will have the effect of weighting the data from the strongest magnetic field more heavily than that from the weaker magnetic field.

A more pronounced bias in the direction of the stronger field result is provided by choosing:

$$w_1 = |B_H|^2/(|B_H|^2 + |B_v|^2) \tag{111}$$

$$w_2 = |B_v|^2/(|B_H|^2 + |B_v|^2) \tag{112}$$

In each of the above equations, $$w_1 w_2 = 1 \tag{113}$$

as is necessary not to artificially inflate or deflate the estimation of the magnitude of the power flow.

In general, more complex combinations of $MW_H$, $MVAR_H$, $MW_v$, and $MVAR_v$ may be employed as $$MW = f(MW_H, MVAR_H, MW_v, MVAR_v, |B_H|, |B_v|) \tag{114}$$

where "f" is a linear or nonlinear function of six variables.

Figure 13:
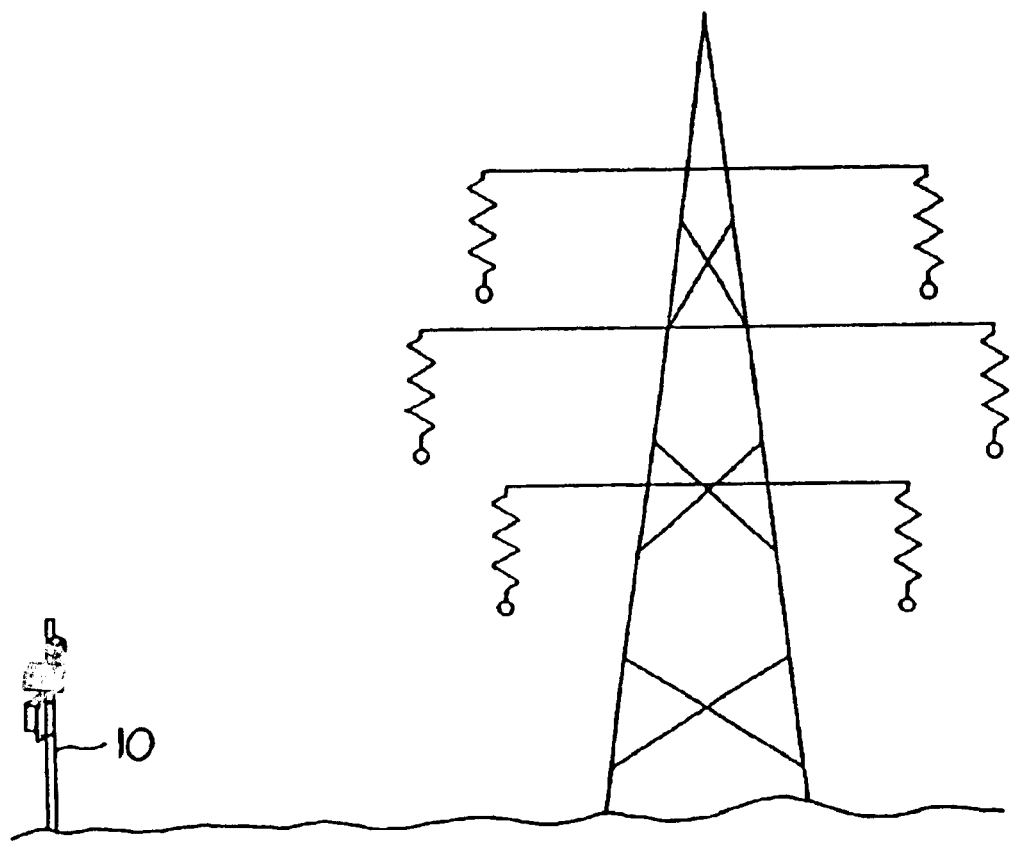
FIG. 13 depicts a common arrangement of electric power transmission lines in which independent parallel circuits are disposed on opposite sides of a supporting tower.

However, a more important advantage than mere noise reduction accrues from the inclusion of both magnetic field sensors, measuring both horizontal and vertical flux density components. A frequently occurring arrangement in electric power transmission lines is the case of parallel circuits disposed on opposite sides of a single supporting tower, as in FIG. 13.

A parallel analysis to that given here for the single three-phase circuit leads to exactly the same form of conclusion as that presented in equations (37) and (38), except that equations (37) and (38) become $$B_H = a_{11} I_1 + a_{12} I_4 \tag{115}$$

$$B_v = a_{21} I_1 + a_{22} I_4 \tag{116}$$

where $I_1$ is the phase current on the top conductor of the left circuit, while $I_4$ is the phase current on the top conductor of the parallel left circuit. (The two three-phase circuits may be carrying different currents.) Expressed in vector-matrix form, equations (115) and (116) become:

$$\begin{Bmatrix} B_H \\ B_V \end{Bmatrix} = \begin{pmatrix} a_{11} & a_{12} \\ a_{21} & a_{22} \end{pmatrix} \begin{Bmatrix} I_1 \\ I_4 \end{Bmatrix} \tag{117}$$

if it is assumed that $V_{LL}$ is the same for both circuits, and where:

$$A_{11} \triangleq 2 \left\{ \frac{A}{r_{11}} \sin\phi_{11} + \frac{B}{r_{12}} \sin\phi_{12} + \frac{C}{r_{13}} \sin\phi_{13} \right\} \tag{118}$$

$$A_{12} \triangleq 2 \left\{ \frac{A}{r_{14}} \sin\phi_{14} + \frac{B}{r_{15}} \sin\phi_{15} + \frac{C}{r_{16}} \sin\phi_{16} \right\} \tag{119}$$

$$A_{21} \triangleq -2 \left\{ \frac{A}{r_{11}} \cos\phi_{11} + \frac{B}{r_{12}} \cos\phi_{12} + \frac{C}{r_{13}} \cos\phi_{13} \right\} \tag{120}$$

$$A_{22} \triangleq -2 \left\{ \frac{A}{r_{14}} \cos\phi_{14} + \frac{B}{r_{15}} \cos\phi_{15} + \frac{C}{r_{16}} \cos\phi_{16} \right\} \tag{121}$$

$r_{ij}$ is the distance from the sensor location to the $j^{th}$ conductor, and $\theta_{1j}$ is the angle between the line-of-sight to the $j^{th}$ conductor and the positive x-axis.

Equation (117) may be re-written in vector-matrix form as:

$$B = AI \tag{122}$$

which is the standard form of a set of simultaneous linear equations in n unknowns:

$$AI = B \tag{123}$$

Equation (123) may be solved in several ways for I:

$$I = A^{-1} B \tag{124}$$

or equation (123) may be solved by Gaussian elimination. Of course, in equation (123), I is a 2-vector of complex phasors, B is a 2-vector of complex phasors, and A is a 2×2 matrix of complex co-efficients.

Also, equation (123) may be solved by the use of Cramer's Rule, leading to:

$$I_1 = \frac{\begin{vmatrix} B_H & a_{12} \\ B_V & a_{21} \end{vmatrix}}{\begin{vmatrix} a_{11} & a_{12} \\ a_{21} & a_{22} \end{vmatrix}} \quad (125)$$

$$I_2 = \frac{\begin{vmatrix} a_{11} & B_H \\ a_{21} & B_V \end{vmatrix}}{\begin{vmatrix} a_{11} & a_{12} \\ a_{21} & a_{22} \end{vmatrix}} \quad (126)$$

In other words, the frequently occurring case of two parallel transmission line circuits may be handled with one sensor package containing one electric potential sensor, one horizontal magnetic field sensor, and one vertical magnetic field sensor—with the computational requirement that two equations in two (complex) unknowns with complex co-efficients must be solved. Since both Fortran and C++ programming languages provide support for complex data types, this analysis is easily carried out numerically by one of the above three indicated methods.

The foregoing computational analysis thus allows for calculation of the magnitude and direction of the electric power flowing through a given transmission line from data collected by the monitoring device 10 of the present invention. As discussed, this computational analysis is preferably carried using a digital computer program at the central processing facility. However, if preferred, thus computational analysis could also be carried out by the microprocessor associated with the monitoring device itself.

It will be obvious to those skilled in the art that modifications may be made to the embodiments described above without departing from the spirit and scope of the present invention.

What is claimed is:

1. An apparatus for remotely measuring electric potential and magnetic flux density associated with an electric power transmission line, comprising:
    a first sensor for outputting a voltage proportional to a net electric potential associated with said transmission line;
    a second sensor responsive to a first vector component of a magnetic flux density associated with said transmission line and outputting a voltage proportional to the time rate of change of the net magnetic flux density generated by current flowing through said transmission line;
    a third sensor responsive to a second vector component of the magnetic flux density associated with said transmission line and outputting a voltage proportional to the time rate of change of the net magnetic flux density generated by current flowing through said transmission line;
    respective amplification and filtration circuits and an analog-to-digital convertor for filtering and converting each of the output voltages associated with each sensor into representative digital data;
    a memory element for storing said representative digital data; and
    a transceiver for transmitting said representative digital data from said memory element to a central processing facility;
    wherein said first, second, and third sensors are located remote from said electric power transmission line and stored in a first substantially weatherproof housing, and wherein said transceiver is also located remote from said electric power transmission line but is stored in a second substantially weatherproof housing; and
    wherein said memory element, said respective amplification and filtration circuits, and said analog-to-digital convertor are also located in one of the substantially weatherproof housings.

2. An apparatus as recited in claim 1, and further comprising a battery for powering the sensors of the apparatus, said battery being stored in said second weatherproof housing.

3. An apparatus as recited in claim 2, wherein said battery is continuously recharged by a solar panel array.

4. A method for monitoring the electric power transmission through at least one electric power transmission line having conductors in a particular physical arrangement and communicating electric power transmission information, comprising the steps of:
    (a) measuring the electric potential, the electrical potential having a phase, and at least one vector component of the magnetic flux density, the magnetic flux density also having a phase, associated with said transmission line to generate a data set by:
        (i) a first sensor for outputting a voltage proportional to the electric potential associated with said transmission line,
        (ii) a second sensor responsive to a first vector component of the magnetic flux density associated with said transmission line and outputting a voltage proportional to the time rate of change of the magnetic flux density generated by current flowing through said transmission line, and
        (iii) a third sensor responsive to a second vector component of the magnetic flux density associated with said transmission line and outputting a voltage proportional to the time rate of change of the magnetic flux density generated by current flowing through said transmission line, wherein the outputted voltage associated with each sensor is passed through a respective amplification and filtration circuit to amplify the respective voltages and remove extraneous noise;
    (b) transmitting said data set to a central processing facility;
    (c) performing a computational analysis on said data set to determine the amount of current and the direction of current flowing through said transmission line, and then computing the power associated with said transmission line through the following sub-steps:
        (i) correcting said data set to compensate for predictable errors relating to the geometry of the particular physical arrangement of the conductors of said transmission line,
        (ii) correcting said data set to compensate for predictable errors relating to the sensors and their interaction with the respective amplification and filtration circuits,
        (iii) calculating the complex coefficients relating the measured magnetic flux density to the current through the conductors of said transmission line as determined by the geometry of the particular physical arrangement of the conductors of said transmission line,
        (iv) solving a set of linear algebraic equations relating the magnetic flux density to the current through the conductors of said transmission line, (v) combining the phase of the measured electric potential with the phase of the measured magnetic flux density to determine the phase angle of the current through said transmission line with respect to a voltage on said transmission line, (vi) calculating the power factor on said transmission line, and (vii) determining the magnitude and direction of real and reactive power on said transmission line; and (d) communicating said power transmission information to an end user.

5. A method as recited in claim 4 in which the transmission of said data set to the central processing facility is accomplished through a landline network.

6. A method as recited in claim 4 in which the transmission of said data set to the central processing facility is accomplished through a wireless network.

7. A method as recited in claim 4 in which the compiled power generation information associated with said transmission line is communicated to the end user through a global computer network.

8. A method as recited in claim 7 in which said global computer network is the Internet, and compiled power generation information being communicated and displayed through a conventional Internet browser.

* * * * *

UNITED STATES PATENT AND TRADEMARK OFFICE
CERTIFICATE OF CORRECTION

| | | |
|---|---|---|
| PATENT NO. | : 6,771,058 B2 | Page 1 of 1 |
| APPLICATION NO. | : 10/300325 | |
| DATED | : August 3, 2004 | |
| INVENTOR(S) | : Lapinski et al. | |

It is certified that error appears in the above-identified patent and that said Letters Patent is hereby corrected as shown below:

On Section (60) on the front page should read: Provisional application No. ~~60/226,130~~ 60/226,131, filed on Aug. 18, 2000, and provisional application No. 60/196,720, filed on Apr. 13, 2000.

Signed and Sealed this

Twenty-ninth Day of May, 2007

JON W. DUDAS
*Director of the United States Patent and Trademark Office*